United States Patent
Dunsmore

(10) Patent No.: US 7,170,297 B1
(45) Date of Patent: Jan. 30, 2007

(54) TRANSMISSION RESPONSE MEASUREMENT SYSTEM AND METHOD OF USING TIME GATING

(75) Inventor: Joel P. Dunsmore, Sebastopol, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/384,928

(22) Filed: Mar. 20, 2006

(51) Int. Cl.
 *G01R 31/11* (2006.01)
 *G01R 27/28* (2006.01)
 *G01R 35/00* (2006.01)

(52) U.S. Cl. .................. 324/534; 324/615; 702/109

(58) Field of Classification Search .......... 324/534, 324/512, 500, 423, 600, 602, 605, 612, 615, 324/617, 637, 638, 642; 702/109
See application file for complete search history.

(56) References Cited

U.S. PATENT DOCUMENTS

| | | | |
|---|---|---|---|
| 4,636,717 A | 1/1987 | Sharrit et al. | |
| 5,524,281 A * | 6/1996 | Bradley et al. | .......... 455/67.15 |
| 6,172,510 B1 | 1/2001 | Liu | |
| 6,356,163 B1 | 3/2002 | Dunsmore et al. | |
| 6,380,819 B1 | 4/2002 | Dunsmore et al. | |
| 6,486,676 B2 * | 11/2002 | Noe | ............................ 324/534 |
| 7,013,229 B2 * | 3/2006 | Wong et al. | ............... 702/107 |
| 2003/0032000 A1 * | 2/2003 | Liu et al. | ........................ 435/4 |
| 2003/0125894 A1 * | 7/2003 | Dunsmore et al. | .......... 702/109 |
| 2005/0091015 A1 * | 4/2005 | Adamian | ....................... 703/2 |
| 2006/0003723 A1 * | 1/2006 | Shoulders et al. | .......... 455/286 |

* cited by examiner

*Primary Examiner*—Andrew Hirshfeld
*Assistant Examiner*—Hoai-An D. Nguyen

(57) ABSTRACT

A method and a measurement system determine a transmission response of a device under test (DUT). The method includes measuring a reflection response from a first port of the DUT while a known reflective termination is on a second port of the DUT, and time gating the measured reflection response to produce a gated reflection response that is the transmission response of the DUT. The measurement system includes a vector network analyzer, a controller, a memory and a computer program. The computer program includes instructions that implement measuring the reflection response from the first port of the DUT, and further implement time gating the measured reflection response. The time gating isolates reflection data associated with the known reflective termination from the measured reflection response.

22 Claims, 5 Drawing Sheets

TRANSMISSION RESPONSE MEASUREMENT SYSTEM AND METHOD OF USING TIME GATING

CROSS-REFERENCE TO RELATED APPLICATIONS

N/A

STATEMENT REGARDING FEDERALLY SPONSORED RESEARCH OR DEVELOPMENT

N/A

BACKGROUND

A transfer function or transmission response represented as a function of frequency characterizes a performance of a radio frequency (RF) device under test (DUT) in a frequency domain. The transmission response, sometimes also termed a 'complex transmission response', is generally specified either in terms a real response and an imaginary response (i.e., as a complex number) or equivalently in terms of a magnitude response and a phase response of the DUT as a function of frequency across a band or range of frequencies of interest. For example, the transmission response of a DUT may comprise a magnitude response and a phase response of the DUT measured or otherwise determined at a plurality of frequencies spanning an operational frequency range of the DUT. The transmission response essentially characterizes an effect that the DUT has on signals passing through the DUT.

The transmission response is normally measured by introducing a test signal at a port or ports of the DUT and measuring the signal as it exits at another port or ports of the DUT. A magnitude and a phase of the test signal entering and exiting the DUT are compared. A measurement or determination of the transmission response of the DUT is derived from the comparison.

For example, a transmitter and a receiver of a measurement system may be attached to a first port (i.e., port-1) and a second port (i.e., port-2) of the DUT, respectively. By comparing the magnitude and the phase of the signal received by the receiver with the magnitude and the phase of the signal transmitted by the transmitter, the magnitude response and the phase response of the DUT are measured. A vector network analyzer (VNA) that measures a magnitude and a phase of a forward transmission S-parameter (e.g., $S_{21}$) using a swept RF signal is but one example of a measurement system that is employed to determine such a complex transmission response of a DUT.

Unfortunately, in some situations one of the first port and the second port of the exemplary DUT may not be readily accessible for connection to the measurement system (e.g., VNA). For example, when attempting to determine a transmission response of a DUT comprising a long cable installed in a cellular telephone tower or in a wing of an aircraft, one or more of a distance between a first end and a second end of the cable and an inability to readily or directly access one of the ends may preclude connecting a VNA simultaneously to both ends of the cable. In another example, a second end of a DUT may be connected to another device, such as an antenna, in a manner that does not facilitate disconnection and subsequent attachment to a VNA. In such exemplary situations, a conventional forward S-parameter measurement of the DUT using a VNA to determine the transmission response may not be possible or, at the very least, is rendered inconvenient.

BRIEF SUMMARY

In some embodiments of the present invention, a method of determining a transmission response of a device under test (DUT) is provided. The method of determining a transmission response comprises measuring a reflection response from a first port of the DUT while a known reflective termination is on a second port of the DUT. The method of determining further comprises time gating the measured reflection response to isolate reflection data associated with the known reflective termination from the measured reflection response. Time gating produces a gated reflection response that is the transmission response of the DUT.

In other embodiments of the present invention, a measurement system that determines a transmission response of a device under test (DUT) is provided. The measurement system comprises a vector network analyzer, a controller, a memory and a computer program. The computer program comprises instructions that implement measuring a reflection response from a first port of the DUT with the vector network analyzer while a known reflective termination is on a second port of the DUT. The instructions further implement time gating the measured reflection response to isolate reflection data associated with the known reflective termination from the measured reflection response, wherein time gating produces the transmission response of the DUT.

Certain embodiments of the present invention have other features that are one or both of in addition to and in lieu of the features described above. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
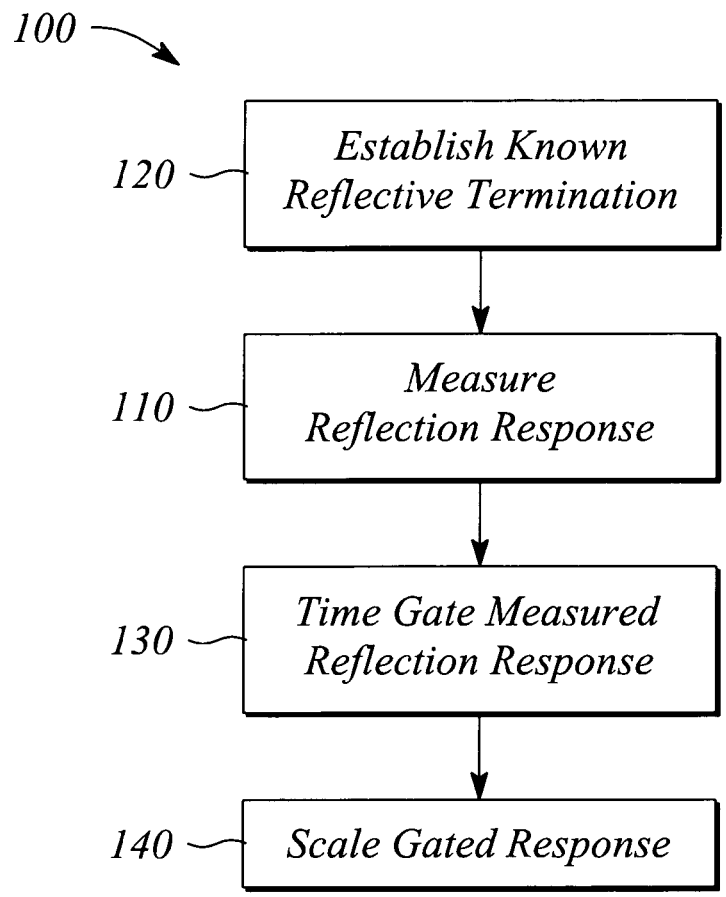
FIG. 1 illustrates a flow chart of a method of determining a transmission response of a device under test (DUT) according to an embodiment of the present invention.

The embodiments of the present invention facilitate determining a transmission response of a device under test (DUT). In particular, according to the various embodiments of the present invention, the transmission response is determined using a measured reflection response in conjunction with time gating of the measured response. The reflection response measurement is performed at a first port (e.g., port-1) of the DUT. The time gating selects or isolates from the measured reflection response a response portion corresponding to a 'known' reflective termination at a second port (e.g., port-2) of the DUT. The reflection response portion isolated by the time gating also referred to herein as a 'gated reflection response' or simply 'gated response' essentially represents the transmission response of the DUT. Specifically, the gated reflection response is a determined two-way transmission response of the DUT. In some embodiments, a one-way transmission response of the DUT may be determined directly from the two-way response.

Among other things, the use of time gating to create the gated reflection response and determining the DUT transmission response from the gated reflection response obviate a need for simultaneous access to both the first port and the second port of the DUT by a measurement system. As such, the various embodiments of the present invention facilitate determination of the transmission response in situations including, but not limited to, when the DUT is installed or embedded in a structure (e.g., aircraft wing, cellular telephone tower, etc.).

According to the various embodiments of the present invention, the reflection response measurement is performed using a reflective termination at the second port of the DUT to produce a measured reflection response or equivalently, measured reflection response data. In some embodiments, the reflective termination is a substantially reflective termination. In some embodiments, the reflective termination has a reflection response that is known and is termed a 'known reflective termination' or simply a 'known termination' herein. In some embodiments, the reflection measurement is performed over a wide bandwidth or a frequency range of interest. In particular, the wide bandwidth or the frequency range of interest may be a range of frequencies that exceeds an operational band or a frequency range of the DUT.

Herein, a 'substantially reflective termination' is a termination that reflects a substantial portion of a signal incident on the termination. As such, a substantially reflective termination may exhibit some moderate absorptive loss associated with one or both of a radiation by the termination and an ohmic dissipation within the termination. Examples of a substantially reflective termination include, but are not limited to, an open circuit termination (either shielded or unshielded) and a short circuit termination. Another example of a substantially reflective termination is an antenna, an aperture of which is covered or blocked by a reflective material or cover (e.g., a metal foil shroud or a metal plate placed over a feed of the antenna). In general, an accuracy of a transmission response determined according to the various embodiments of the present invention improves as the magnitude of the reflection response of the reflective termination approaches a value of one or unity.

A 'known' reflective termination is any reflective termination for which one or both of a magnitude and a phase of the reflection response at an input to the termination is either known a priori or is a measured characteristic of the termination. For example, a reflection response of either a short circuit termination or an open circuit termination is known a priori to have a magnitude equal to about one. In another example, a reflective cover blocking a feed of an antenna is known to reflect a substantial portion of an incident signal back into the antenna and thus, causes the antenna to have a reflection response magnitude that is close to one. In another example, both a magnitude reflection response and a phase reflection response of an open circuit standard or a short circuit standard from a set of calibration standards may be provided by a manufacturer of the calibration standards. Thus, such calibration standards may be employed as known reflective terminations.

In yet another example, a reflective termination (e.g., short circuit or open circuit) constructed for use according to some embodiments of the present invention may be measured using a vector network analyzer (VNA) to establish a magnitude and a phase of the reflection response of the reflective termination. Once measured, the constructed reflective termination is a known reflective termination according to some embodiments of the present invention. In general, the exemplary known reflective terminations described above represent broadband components or devices since the reflection response is generally known and often slowly varying over a broad range of frequencies (e.g., 1.0 to 18.0 GHz).

In some embodiments, a narrow band component or device may be employed as the known, substantially reflective termination. In particular, the narrow band device may be employed as the known reflective termination at least in a frequency range of interest that is outside of the frequency range corresponding to an operational frequency range or band of the device. For example, while many narrow band devices may be relatively non-reflective within the operational band of the device (i.e., in-band), the devices are often substantially reflective outside of the operational band (i.e., out-of-band). Exemplary narrowband devices having a substantially reflective out-of-band reflection responses (i.e., having an out-of-band return loss $S_{11}$ approximately equal to 1.0) include, but are not limited to, narrowband filters, narrowband amplifiers, narrowband switches, and narrowband antennas. The out-of-band reflection response of such narrow band devices may be either measured or known a priori. One skilled in the art may readily recognize additional reflective terminations that are generally applicable to and within the scope of the various embodiments of the present invention. For example, the skilled artisan may recognize a reflective termination not mentioned above having either a priori known reflection responses or for which a known reflection response may be readily determined by, for example, direct measurement thereof. All such reflective terminations are within the scope of the various embodiments herein.

FIG. 1 illustrates a flow chart of a method of determining a transmission response of a device under test (DUT) according to an embodiment of the present invention. In particular, the method 100 of determining a transmission response uses a one-port reflection response measurement and time gating. In some embodiments, the determined transmission response is a complex transmission response comprising both a magnitude response and a phase response. In addition, a delay of the DUT may be determined from the determined transmission response. In some embodiments, the transmission response is determined over a band or range of frequencies of interest according to the method 100.

While generally applicable to essentially any DUT, in some embodiments, the method 100 of determining a transmission response requires access by a measurement system to only one port of the DUT. As such, the method 100 of the present invention facilitates determining the DUT transmission response even when another port of the DUT is substantially unavailable or inaccessible to a measurement system employed to produce the one-port reflection response measurement.

As illustrated in FIG. 1, the method 100 of determining a transmission response comprises measuring 110 a reflection response of the DUT at a first port (e.g., port-1) of the DUT. The reflection response is measured 110 with a known reflective termination at a second port of the DUT (e.g., port-2). Measuring 110 a reflection response produces a measured reflection response or reflection response data for the DUT.

In some embodiments, the reflection response is measured 110 in a frequency domain using a vector network analyzer (VNA). For example, the VNA may be connected to port-1 of the DUT with the known reflective termination connected to port-2 of the DUT. The VNA produces a reflection S-parameter measurement at port-1 represented by a return loss $S_{11}$. By convention, the return loss $S_{11}$ is represented by measured response data in the frequency domain. In some embodiments, the reflection response (e.g., return loss $S_{11}$) is measured 110 for a range or band of frequencies that includes an operational frequency range or a frequency range of interest for the DUT. In general, a wider range of frequencies over which the reflection response is measured 110 produces a better, more accurate determination of the DUT transmission response according to the method 100.

In other embodiments, the reflection response is measured 110 using time domain reflectometry (TDR), such as by using a TDR system. For example, the TDR system may be connected to port-1 of the DUT while the known reflective termination is connected to port-2 of the DUT. The TDR system produces the measured reflection response of the DUT wherein the measured response data is in a time domain.

In some embodiments, the method 100 of determining a transmission response further comprises establishing 120 a known reflective termination at the second port of the DUT. In some embodiments, establishing 120 is performed prior to measuring 110 a reflection response of the DUT.

In some embodiments, establishing 120 comprises attaching a substantially reflective termination having a known reflection response to the second port of the DUT. For example, an open circuit termination or a short circuit termination such as, but not limited to, an 'open' calibration standard and a 'short' calibration standard from a short-open-load-thru (SOLT) calibration standard set may be attached to the second port to establish 120 the known reflective termination. In another example, an uncalibrated one of an open circuit termination or a short circuit termination may be attached to establish 120 the known reflective termination. In such embodiments, the reflection response of the uncalibrated one of the open circuit termination and the short circuit termination may be either known a priori or may be measured using, for example, the VNA.

The reflection response of the uncalibrated termination may be measured either before or after employing (e.g., as in establishing 120) the uncalibrated termination as the known reflective termination in the method 100. If the reflection response is measured after the uncalibrated termination is employed in method 100, the results of the measurement may be employed to correct the determined transmission response for the DUT by well-known de-embedding methods, for example.

In yet another example, the reflective termination may be established 120 by disconnecting the second port of the DUT from another device to which the second port had been connected so as to produce essentially an open circuit at the second port. Alternatively, a conductor may be placed across, or used to block, otherwise disconnected terminals of the second port of the DUT to create a short circuit termination, for example.

In other embodiments, establishing 120 a known reflective termination comprises altering a performance characteristic of a device that is connected to the second port of the DUT such that the device provides a known reflection response. This is particularly useful when the second port of the DUT is essentially inaccessible. For example, a reflective cover placed over a feed or aperture of an antenna attached to the second port establishes 120 a known reflection response at the second port of the DUT that is connected to the antenna. In another example, wherein a reflective switch is attached to the second port of the DUT, the switch may be placed in an 'OFF' or reflective mode to establish 120 the known reflection response.

In yet other embodiments, establishing 120 a known reflective termination comprises merely recognizing the presence of a device connected to the second port of the DUT that provides a known, substantially reflective response over at least a portion of a frequency range of interest. For example, a narrow band antenna or a narrow band filter having a substantially reflective out-of-band input reflection response may be recognized as and thus, effectively establishes 120, the known reflective termination. Specifically, the exemplary narrow band antenna or filter may be employed as the known reflective termination for determining a transmission response of the DUT except within the operational band (i.e., in-band frequencies) of the antenna or filter. As such, interpolation may be employed to complete the method 100 of determining the transmission response of the DUT across an entire frequency range of interest that includes both the in-band and out-of-band frequencies of the exemplary antenna or filter.

Referring again to FIG. 1, the method 100 of determining a transmission response further comprises time gating 130 the measured reflection response of the DUT. Time gating 130 produces a gated reflection response or gated response data. The time gating 130 essentially isolates a portion of the DUT reflection response data that is associated with the known reflective termination at the second port of the DUT. In particular, time gating 130 preferentially selects and preserves from the measured reflection response a portion of the reflection response corresponding to a reflection from the known reflective termination. Time gating 130 reduces, and in some embodiments, essentially eliminates, any other reflection responses within the measured reflection response that may be associated with other sources of reflection, as described below. As such, by having the reflection response of the second port of the DUT, the transmission response can be determined according to the method 100.

For example, other sources of reflection that may be present in the measured reflection response of the DUT include, but are not limited to, an input mismatch of the DUT and internal discontinuities of the DUT. In some cases, the other sources of reflection produce responses that are much larger than that produced by the known termination. The reflection responses from such other sources are either reduced or eliminated from the gated reflection response during time gating 130, depending on the embodiment.

In some embodiments, time gating 130 is implemented using a time domain filter or equivalently, a gating window function. A gating window function is a signal processing function that preferentially passes data within a window of the function while essentially blocking data that lies outside the window from passing. In some embodiments, the gating window function is applied to or acts on the reflection response data that has been first transformed to the time domain.

In some embodiments, the gating window function may have a rectangular shaped window or may be implemented as a rectangular window function. A rectangular window function passes data within the window to pass essentially unaltered while data that is outside the window is blocked by the window function. By blocking or filtering data outside of the window of the rectangular window function, essentially only the data inside the rectangular window remains after time gating 130.

In other embodiments, other window functions that are essentially non-rectangular may be employed for time gating 130. Non-rectangular window functions may apply a form of weighting to one or both of the data inside the window of the window function and the data outside the window. Non-rectangular windows may not block but only reduce a level of data outside the window while differentially scaling the data within the window. For example, the window function may be a Gaussian window function having a Gaussian-shaped window that applies a differential Gaussian weighting to the data. In another example, the window function is a Kaiser-Bessel function which is known to provide excellent control of sidelobes. Control of sidelobes can be useful in time gating 130, according to some embodiments. One skilled in the art is familiar with a wide variety of window functions, including but not limited to a Hanning window function and a Hamming window function, all of which are within the scope of the present invention.

Figure 2:
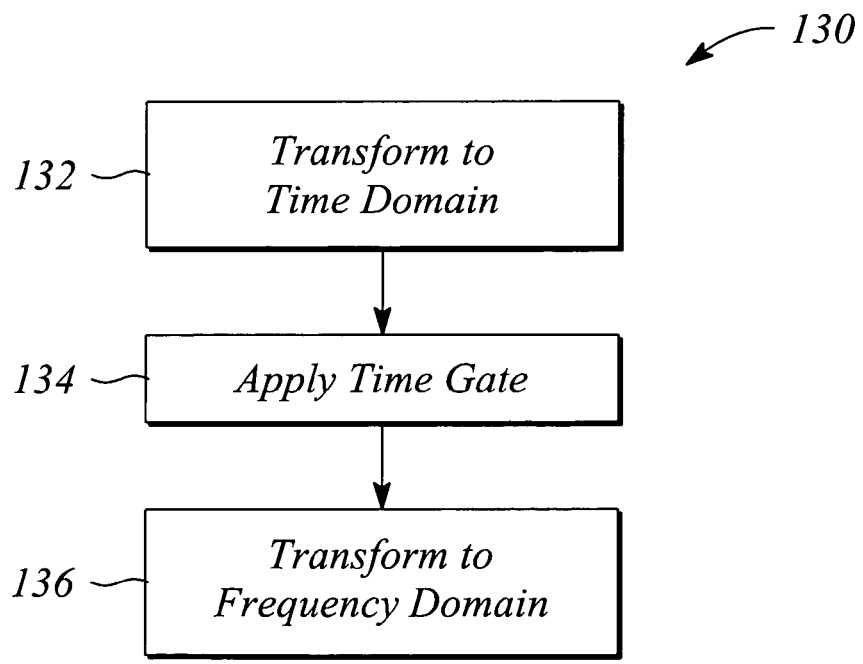
FIG. 2 illustrates a flow chart of a time gating technique according to an embodiment of the present invention.

FIG. 2 illustrates a flow chart of a time gating 130 technique according to an embodiment of the present invention. As illustrated in FIG. 2, time gating 130 comprises transforming 132 the measured reflection response to the time domain from the frequency domain. Transforming 132 produces a transformed 132 response or transformed 132 response data. According to various embodiments, transforming 132 the measured reflection response may employ various transform methodologies such as, but not limited to, a Fourier Transform, a fast Fourier Transform (FFT), or related data transform techniques. One skilled in the art is familiar with such transform methodologies and their use in transforming data from the frequency domain to the time domain.

For example, transforming 132 the measured reflection response to the time domain may comprise employing a time domain transform native to the VNA. Exemplary VNAs such as, but not limited to, E8362B PNA Network Analyzer, manufactured by Agilent Technologies, Inc., Palo Alto, Calif., provide native time domain transforms that may be employed for transforming 132 the measured reflection response. In another example, transforming 132 the measured reflection response to the time domain may comprise processing the reflection response data using a signal processor or general purpose computer running a numerical computational environment or program such as, but not limited to, Matlab® and using one of several transform-implementing functions available in Matlab®. Matlab® is a numerical computational environment published by The Mathworks, Inc., Natack, Mass.

As illustrated in FIG. 2, time gating 130 further comprises applying 134 a time gate to the transformed 132 response. Applying 134 a time gate yields a time-gated response or time-gated response data. Applying 134 a time gate essentially isolates, in the time-gated response, a portion of the transformed 132 response corresponding to the reflection at the known reflective termination.

In some embodiments, applying 134 a time gate comprises employing a gating window function to process the transformed 132 response data. In such embodiments, a window of the gating window function may be centered approximately at a time point in the time domain that corresponds to a location of a reflection produced by the known reflective termination. The employed gating window function essentially preserves, in the data processed, a portion of the time domain reflection response inside the window of the window function. The gating window function further reduces or essentially eliminates (e.g., sets to zero) a portion of the transformed 132 response outside of the window of the gating window function.

In particular, in some embodiments, the window of the gating window function is approximately located or centered at a time index of the transformed 132 response data corresponding to a reflection caused by the reflective termination. The location of the termination may be determined from one or both of a priori knowledge of an electrical length of the DUT and a characteristic of the transformed 132 response data. For example, a propagation time through the DUT may be known a priori. Given the known propagation time, the gating window function is centered approximately at the time index of the transformed 132 response data corresponding to the known propagation time. Alternatively, a characteristic of the transformed 132 response data such as, but not limited to, a peak in a magnitude of the data, may be employed to locate one or both of a reflection and a center of the gating window function.

In addition to a center, the gating window function generally has a gate width (i.e., window width) representing a duration of the applied 134 time gate. In some embodiments, the gate width of the gating window function is arbitrary. In other embodiments, the gate width is determined by an approximate extent of the known reflective termination-caused reflection.

In general, the duration of the applied 134 time gate or the gate width of the gating window function may be adjusted to improve an accuracy or general quality of the transmission response determined according to the method 100 of the present invention. Typically, a wider window of the gating window function yields an improved accuracy. However, in some embodiments where another reflection may be present near the reflective termination, a window width may be reduced to eliminate a response associated with the other reflection.

As such, in some embodiments, applying 134 a time gate further comprises one or both of identifying a location of the reflection and determining an extent of the reflection, each corresponding to the known reflective termination. For example, identifying the location may be based on a time index of transformed 132 response data, as discussed above. Thus, identifying a location of the reflection may include employing a priori knowledge of an approximate electrical length of the DUT and having known the electrical length of the DUT, estimating a propagation time from an input of the DUT at the first port to an output at the second port of the DUT. Since the reflective termination is located at the second port, knowing the propagation time provides an indication of the time index corresponding to the reflection response of the reflective termination.

Determining an extent of the reflection response facilitates setting a width of the time gate window function. In particular, the width of the time gate window function is established to substantially encompass the determined extent. In general, a wider time gate window function width yields higher resolution in the determined transmission response. However, a wider time gate window function width may also reduce an accuracy of the determined transmission response by including reflections that are not associated with the known reflective termination. Thus, determining an extent of the reflection response and setting the time gate window function width accordingly may yield relatively higher resolution and higher accuracy than without employing the determined extent.

In some embodiments, an extent is assumed and a fixed time gate window function width is employed. In other embodiments, the extent is determined by examining the transformed 132 response data in a vicinity of the reflective termination-caused reflection. A time gate window function width that essentially encompasses the extent is then employed.

For example, a characteristic of the transformed 132 response at a location of the reflective termination is often a peak in a magnitude of the transformed 132 reflection response in the time domain. A magnitude of the response may be observed to decrease away from the reflective termination location. Typically, the magnitude response will continue to decrease until either a noise floor is encountered or a reflection associated with another source of reflection begins to be evident in the transformed 132 response data.

In some embodiments, the extent of the reflection response may be determined as a time index-based distance from the reflective termination-caused reflection to where the observed decrease in magnitude ceases. Such an extent essentially establishes a target maximum width of the time gate window function. Typically, the width of the time gate window function is set to be somewhat less than the determined target maximum extent to insure that the determined transmission response is based primarily on the reflective termination-caused reflection and does not include significant contributions from other reflections. The skilled artisan may readily determine the extent and set the width of the time gate window function without undue experimentation.

In some embodiments, applying 134 a time gate is performed using a native windowing or gating function of the VNA. For example, E8362B PNA Network Analyzer, mentioned above, provides native time gating. In other embodiments, a signal processing algorithm of a signal processor or computer that implements data windowing may be employed. For example, Matlab® provides a variety of built-in window functions that may be used to implement the time gate window function of applying 134 a time gate in time gating 130 of the method 100.

As illustrated in FIG. 2, time gating 130 the measured reflection response of the DUT further comprises transforming 136 the time-gated response to the frequency domain from the time domain. Transforming 136 the time-gated response produces the gated reflection response or the gated response data of time gating 130 in the frequency domain. Transforming 136 the time-gated response employs a frequency domain transform that is essentially an inverse of the time domain transform employed in transforming 132 the measured reflection response to the time domain.

In some embodiments, a native frequency domain transform provided by the VNA is employed in transforming 136 the time-gated response. For example, the exemplary VNA models listed above provide a native frequency domain transform that may be used in transforming 136 the time-gated response. In other embodiments, the frequency domain transform of transforming 136 is implemented as a function in a signal processor or computer. For example, Matlab® provides several useful time domain to frequency domain transforming functions including, but not limited to, an inverse FFT (IFFT).

In some embodiments of time-gating 130 the measured reflection response of the DUT, transforming 132 the measured reflection response to the time domain may be omitted such as when the measured reflection response is produced in the time domain. For example, embodiments that employ TDR to measure 110 a reflection response render superfluous employing transforming 132 the measured reflection response to the time domain. In another example, time gating 130 the measured reflection response of the DUT may be implemented as a frequency domain transformation of a gating window function. In particular, applying 134 a time gate may be implemented entirely in the frequency domain so that no frequency-to-time domain or time-to-frequency domain transformations are needed. In such exemplary situations, time gating 130 the measured reflection response of the DUT essentially takes place in the frequency domain, rendering unnecessary the use of both transforming 132 to the time domain and transforming 136 to the frequency domain. The skilled artisan may readily determine whether one or both of transforming 132 to the time domain and transforming 136 to the frequency domain are necessary in a given situation without undue experimentation.

Referring back to FIG. 1, time gating 130 the measured reflection response of the DUT of the method 100 produces the gated reflection response or gated reflection response data. The gated reflection response is essentially a two-way transmission response of the DUT in the frequency domain. In some embodiments, the two-way transmission response of the DUT is the determined transmission response of the DUT according to the method 100. In particular, the two-way transmission response (i.e., both the magnitude response and the phase response) is directly related to the one-way transmission response of the DUT. Moreover, the two-way transmission response may be readily transformed into a representation of a one-way transmission response of the DUT by employing appropriate scaling. For example, a magnitude of the two-way transmission response is two times that of a one-way transmission response. Similarly, a phase of the two-way transmission response is twice that of the one-way transmission response phase.

In some embodiments, the method 100 further comprises scaling 140 the gated reflection response to produce a one-way transmission response of the DUT. Scaling 140 comprises multiplying the magnitude of the gated reflection response by a factor of two. Scaling 140 further comprises multiplying the phase of the gated reflection response by a factor of two. The skilled artisan will recognize and appreciate that the phase generally must be unwrapped (e.g., the linear delay removed) prior to scaling 140 of the phase by a factor of two.

Figure 3A:
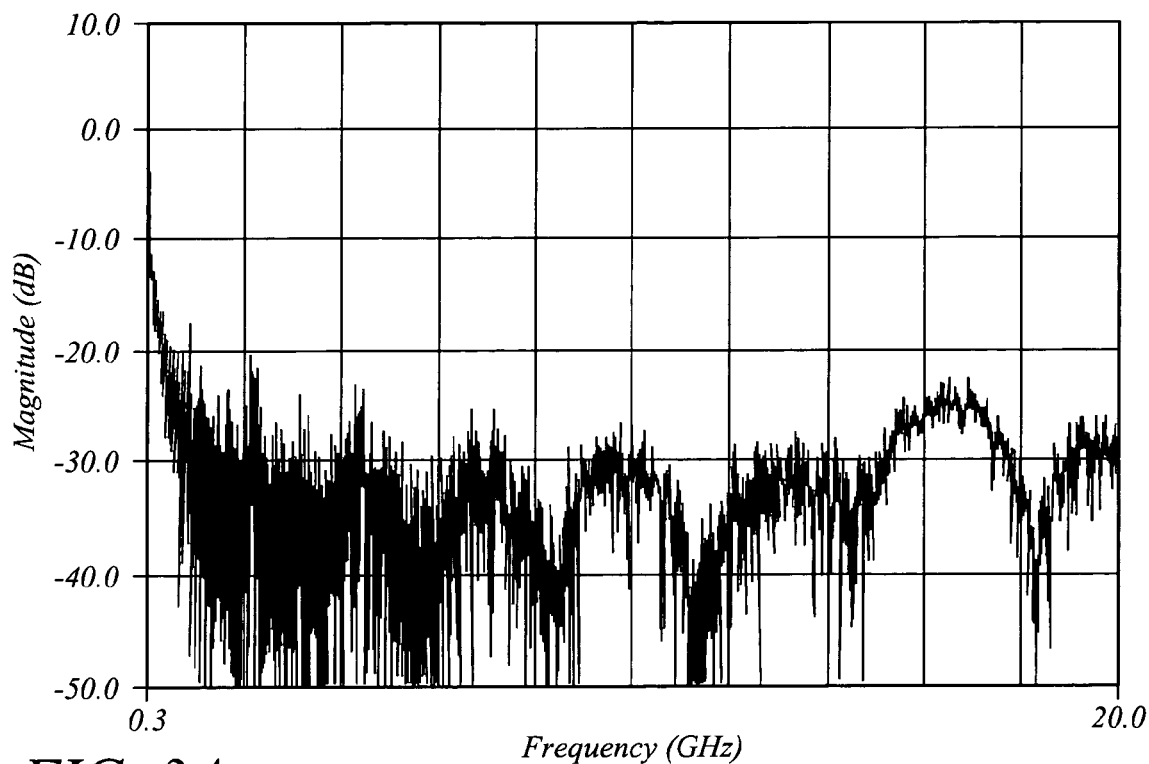
FIG. 3A illustrates a frequency domain plot of a magnitude of an exemplary measured reflection response for a cable (DUT) according to an embodiment of the present invention.

Consider by way of example and not limitation, using the method 100 to determine a transmission response of a DUT where the DUT is a length of cable. For example, the cable may be an antenna feed cable installed in a wing of an aircraft. FIG. 3A illustrates a frequency domain plot of a magnitude of an exemplary measured reflection response for a cable according to an embodiment of the present invention. In particular, FIG. 3A illustrates a plot of a magnitude of a return loss $S_{11}$ measured 110 for the cable (DUT) at port-1. In this example, a known reflective termination was established 120 at a port-2 using an open circuit attached thereto prior to measuring 110.

Figure 3B:
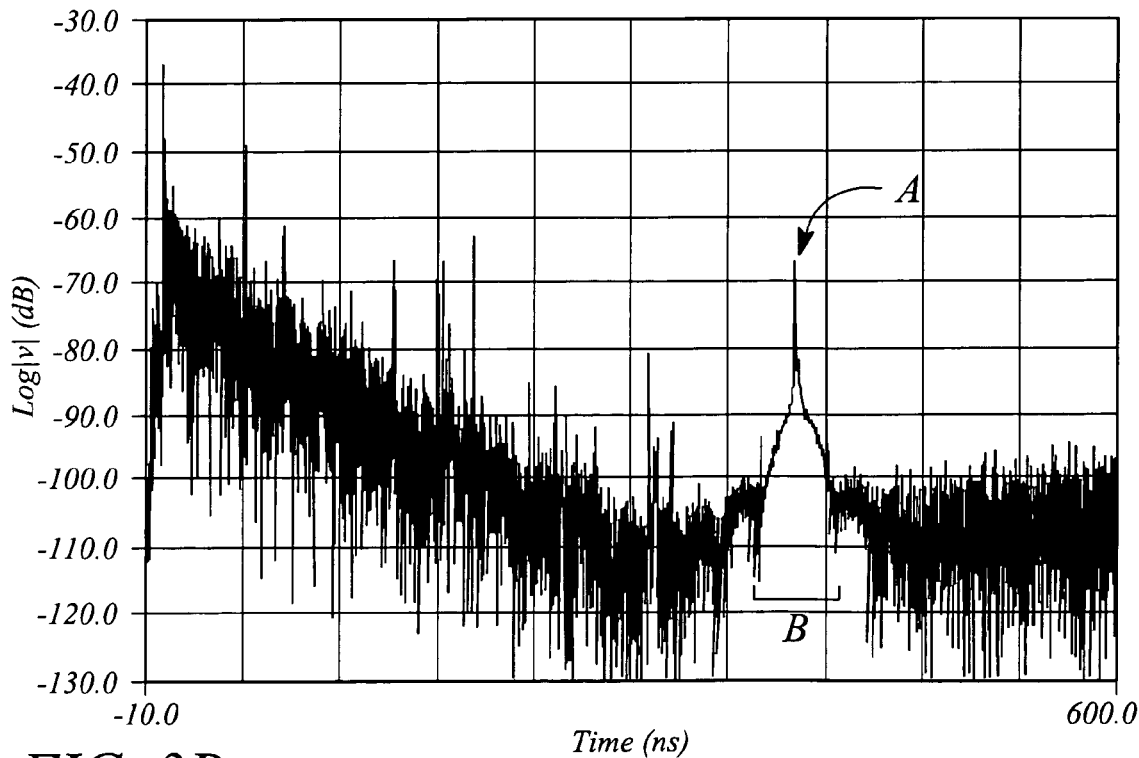
FIG. 3B illustrates a plot of the exemplary measured reflection response of FIG. 3A transformed to the time domain according to an embodiment of the present invention.

FIG. 3B illustrates a plot of the exemplary measured reflection response of FIG. 3A transformed to the time domain according to an embodiment of the present invention. In particular, FIG. 3B illustrates a result of transforming 132 the measured response data of FIG. 3A into transformed 132 response data. Evident in the transformed 132 response data is a peak A indicating a location in the time domain of the known reflective termination. Also evident is an extent of the reflective termination-caused reflection indicated by a bracket B.

Figure 3C:
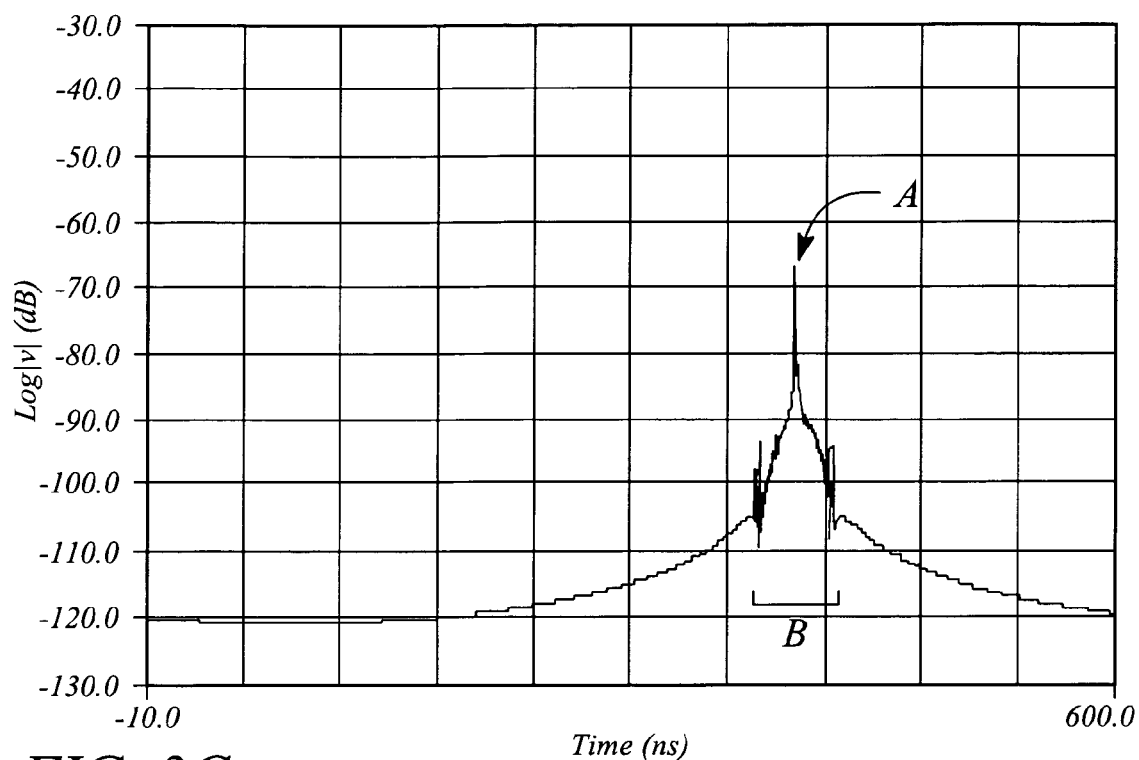
FIG. 3C illustrates a time domain plot of the exemplary measured reflection response of FIG. 3A following time gating according to an embodiment of the present invention.

FIG. 3C illustrates a time domain plot of the exemplary measured reflection response of FIG. 3A following time gating 130 according to an embodiment of the present invention. In particular, a gating window function is used to apply 134 to the exemplary measured response data a time gate centered at the peak A and with a width corresponding to approximately the extent indicated by bracket B. Applying 134 a time gate produces time-gated response data illustrated by the plot of FIG. 3C.

Figure 3D:
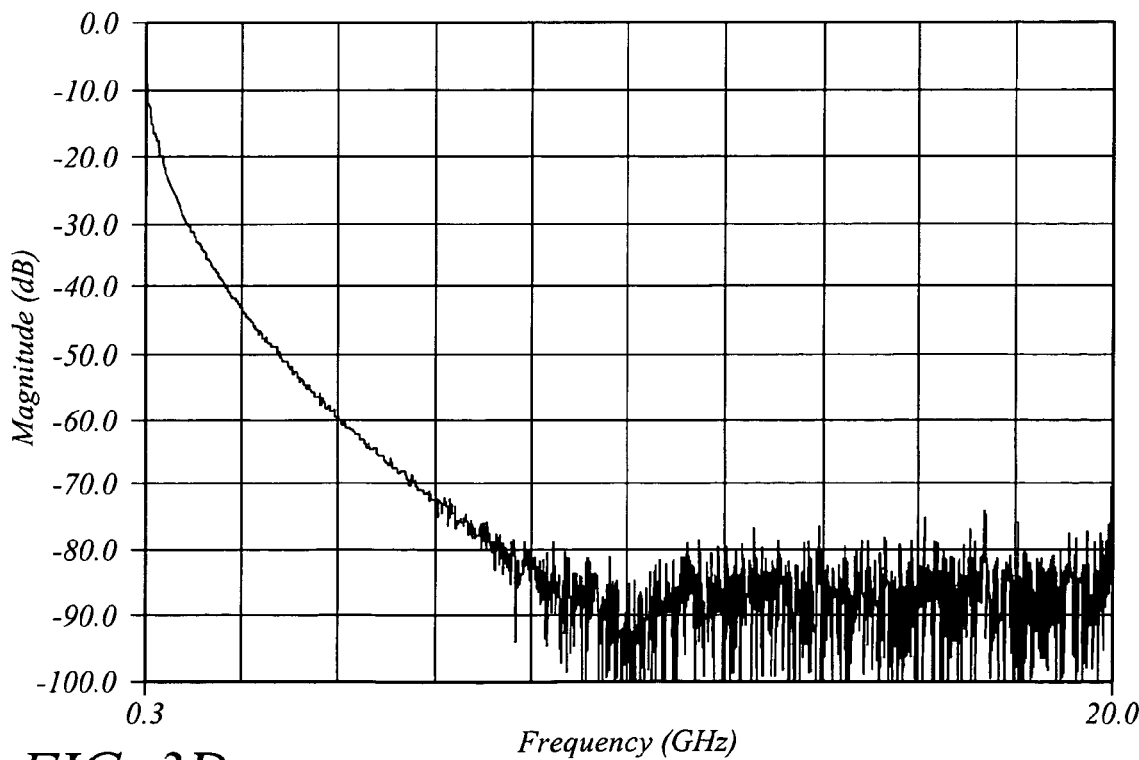
FIG. 3D illustrates a plot of a magnitude of a gated reflection response obtained after transforming the time-gated response of FIG. 3C back to the frequency domain according to an embodiment of the present invention.
Figure 3E:
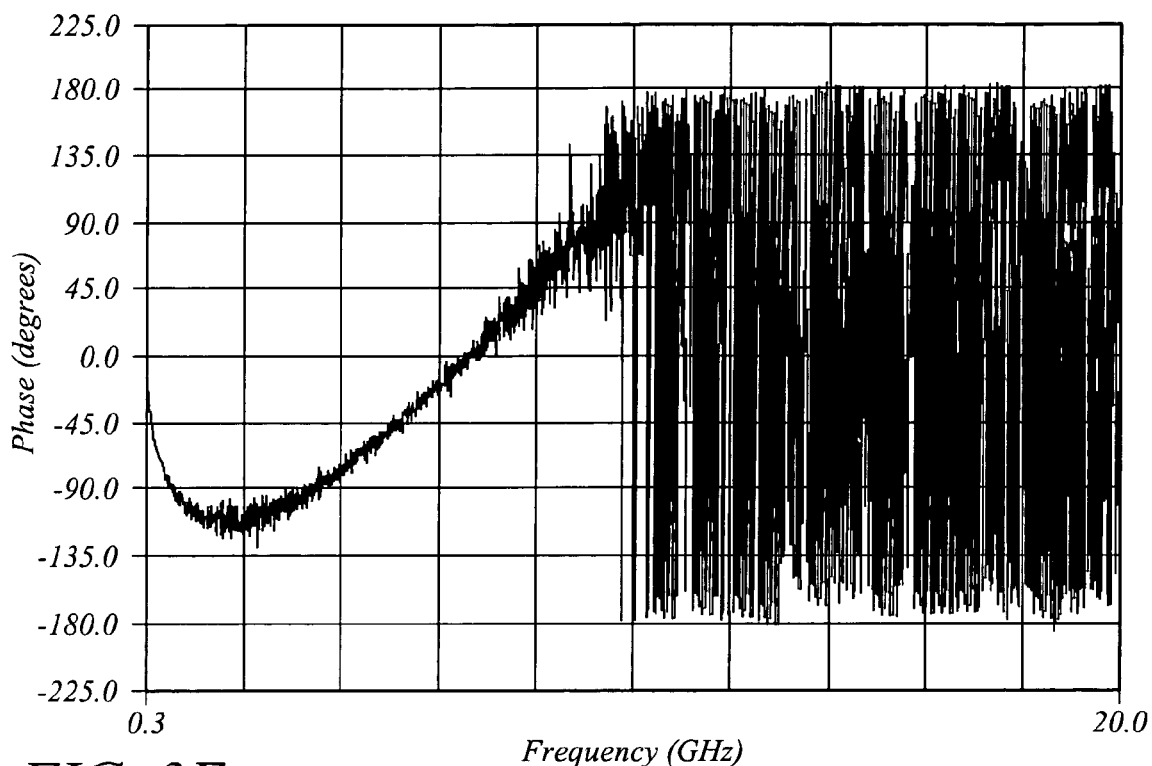
FIG. 3E illustrates a plot of a phase of the gated reflection response obtained after transforming the time-gated response of FIG. 3C back to the frequency domain according to an embodiment of the present invention.

FIG. 3D illustrates a plot of a magnitude of a gated reflection response obtained after transforming the time-gated response of FIG. 3C back to the frequency domain according to an embodiment of the present invention. In FIG. 3D, the gated reflection response is the exemplary measured reflection response following time gating 130 where the time-gated response of FIG. 3C is transformed 136 back to the frequency domain. FIG. 3E illustrates a plot of a phase of the gated reflection response obtained after transforming 136 the time-gated response of FIG. 3C back to the frequency domain according to an embodiment of the present invention. As with FIG. 3D, the gated reflection response in FIG. 3E is the exemplary measured reflection response following time gating 130 where the time-gated response of FIG. 3C is transformed 136 back to the frequency domain. Both the magnitude and the phase of the gated reflection response illustrated in FIGS. 3D and 3E correspond to two-way transmission responses for the exemplary cable DUT. Moreover, the two-way transmission responses illustrated in FIGS. 3D and 3E agree with a two-way transmission response measured using a conventional two-port VNA-based transmission measurement (not illustrated).

Figure 4A:
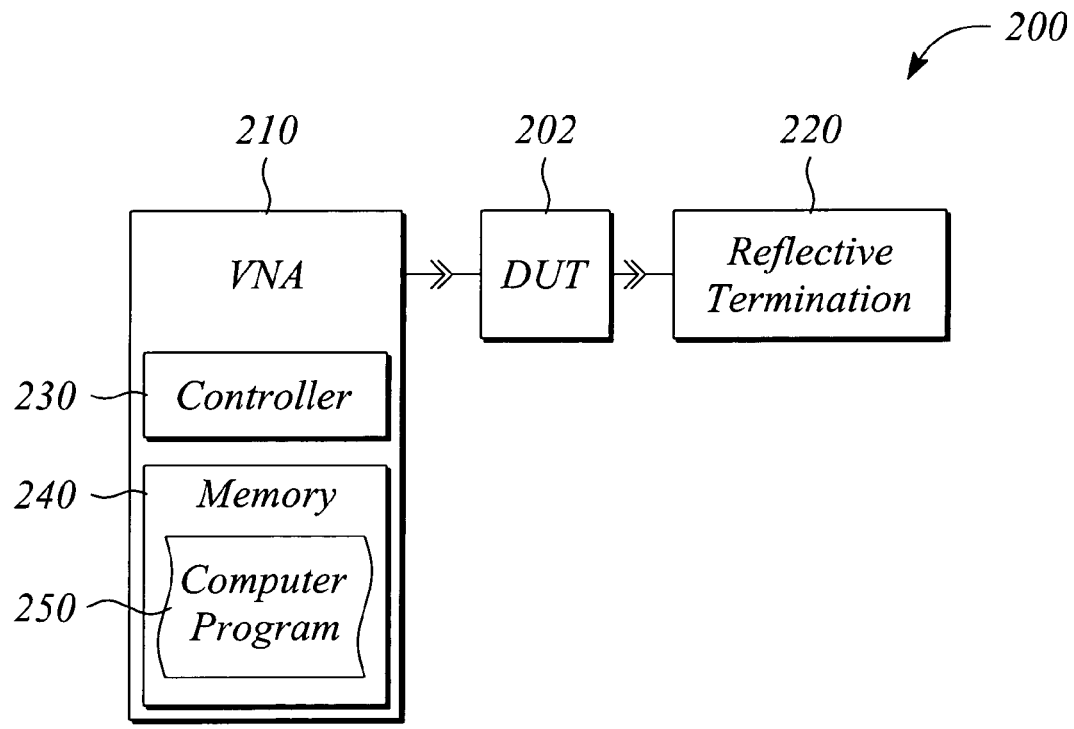
FIG. 4A illustrates a block diagram of a measurement system that determines a transmission response of a DUT according to an embodiment of the present invention.
Figure 4B:
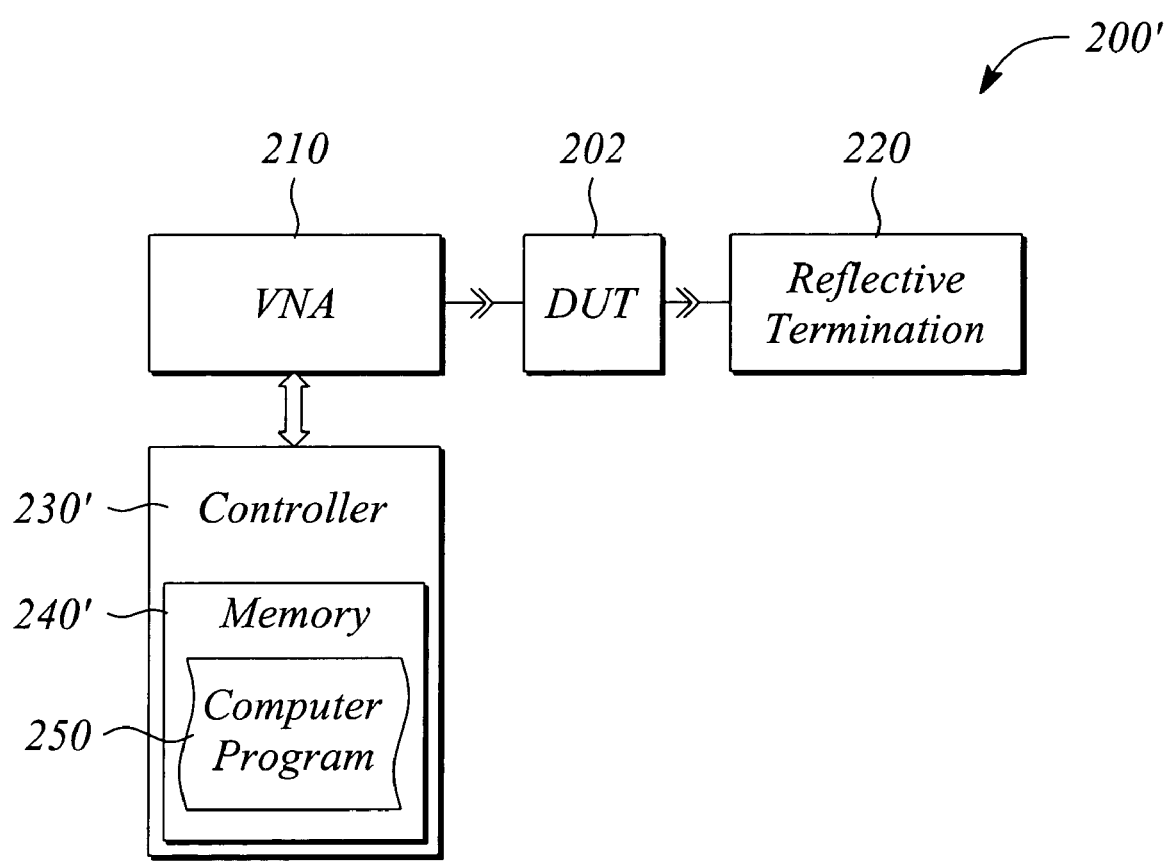
FIG. 4B illustrates a block diagram of a measurement system that determines a transmission response of a DUT according to another embodiment of the present invention.

FIG. 4A illustrates a block diagram of a measurement system 200 that determines a transmission response of a DUT 202 according to an embodiment of the present invention. FIG. 4B illustrates a block diagram of a measurement system 200' that determines a transmission response of a DUT 202 according to another embodiment of the present invention. In particular, the measurement system 200, 200' determines a transmission response of a DUT 202 using a one-port reflection response measurement and time gating according to respective embodiments of the present invention.

The measurement systems 200, 200' comprise a vector network analyzer 210 connected to port-1 of the DUT 202. The measurement systems 200, 200' further comprise a known reflective termination 220 connected to port-2 of the DUT 202. The measurement system 200 of FIG. 4A further comprises a controller 230, a memory 240 and a computer program 250. As illustrated in FIG. 4A, the controller 230 and the memory 240 reside in the VNA 210. In some embodiments, the controller 230 may be a microprocessor or central processing unit (CPU) of the VNA 210. The computer program 250 is stored in the memory 240 and is executed by the controller 230.

The measurement system 200' in FIG. 4B further comprises a controller or processor 230', a memory 240' and the computer program 250. The computer program 250 is stored in the memory 240' and is executed by the controller 230'. In this embodiment, the controller 230' and the memory 240' with the stored computer program 250 are separate from the vector network analyzer 210. For example, the controller 230' may be a general purpose computer. In some embodiments, the controller 230' may be connected to the vector network analyzer 210 by way of a data transfer and control interface enabling the controller 230' to control an operation of the vector network analyzer 210 and to receive data therefrom.

The computer program 250 comprises instructions that, when executed by the controller 230, 230', implement determining a transmission response of the DUT 202 using a one-port reflection response measurement and time gating. In particular, the instructions of the computer program 250 implement measuring a reflection response of the DUT at the first port to produce measured response data. The instructions further implement time gating the measured response data to produce gated response data. The gated response data so produced represent a two-way transmission response for the DUT, as measured from a single port of the DUT. In some embodiments, the instructions further implement scaling the two-way transmission response to better correspond to a one-way transmission response of the DUT. In some embodiments, the instructions of the computer program 250 essentially implement the method 100 of determining a transmission response described above.

Thus, there have been described embodiments of a method of determining a transmission response of a DUT and a measurement system implementing a determination of a transmission response of a DUT. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of determining a transmission response of a device under test (DUT), the method comprising:
   measuring a reflection response from a first port of the DUT while a known reflective termination is on a second port of the DUT; and
   time gating the measured reflection response to isolate reflection data associated with the known reflective termination from the measured reflection response,
   wherein time gating produces a gated reflection response that is the transmission response of the DUT.

2. The method of claim 1, further comprising:
   scaling the gated reflection response, such that the transmission response of the DUT is scaled from a two-way transmission response to a one-way transmission response of the DUT.

3. The method of claim 1, wherein time gating comprises:
   applying a time gate to the measured reflection response such that a time-gated response is produced, the time-gated response comprising a portion of the measured reflection response corresponding to a reflection from the known reflective termination.

4. The method of claim 3, wherein time gating further comprises one or both of:

transforming the measured reflection response from a frequency domain to a time domain prior to applying a time gate; and transforming the time-gated response from the time domain to the frequency domain after applying a time gate.

5. The method of claim 1, wherein the transmission response of the DUT is determined from a one-port reflection response measurement over a range of frequencies of interest that includes an operational frequency range for the DUT.

6. The method of claim 1, further comprising:

establishing the known reflective termination on the second port of the DUT prior to measuring a reflection response from the first port.

7. The method of claim 6, wherein establishing the known reflective termination comprises one or more of:

attaching a known reflective calibration standard to the second port of the DUT;

modifying a device attached to the second port of the DUT such that the device is rendered reflective;

measuring a magnitude and a phase of a reflection response of a termination attached the second port of the DUT to obtain reflection data for the termination; and attaching the second port of the DUT to a device that is reflective outside of an operational band of frequencies of the device, wherein during measuring a reflection response from the first port, measuring at least at frequencies that are outside the operational band.

8. The method of claim 6, wherein the DUT comprises an antenna, and wherein establishing the known reflective termination comprises blocking an aperture of the antenna with a reflector such that the antenna is rendered reflective.

9. The method of claim 1 being implemented as instructions of a computer program that is stored in a memory of a measurement system, the measurement system comprising a vector network analyzer and a controller that controls the vector network analyzer, the instructions of the computer program being executed by the controller to determine the transmission response of the DUT from a one-port reflection response measurement with the vector network analyzer over a range of frequencies of interest that includes an operational frequency range for the DUT.

10. A measurement system that determines a transmission response of a device under test (DUT), the measurement system comprising:

a vector network analyzer;

a controller that controls the vector network analyzer;

a memory that is accessed by the controller; and a computer program stored in the memory and executed by the controller, wherein the computer program comprises instructions that, when executed by the controller, implement measuring a reflection response from a first port of the DUT with the vector network analyzer while a known reflective termination is on a second port of the DUT; and time gating the measured reflection response to isolate reflection data associated with the known reflective termination from the measured reflection response, wherein time gating produces the transmission response of the DUT.

11. The measurement system of claim 10, wherein the vector network analyzer comprises the controller, the memory, and the computer program.

12. The measurement system of claim 10, wherein the vector network analyzer communicates via a data bus to the controller, the controller comprising the memory and the computer program.

13. The measurement system of claim 10, wherein the instructions of the computer program, when executed by the controller, further implement scaling a gated reflection response produced from time gating, such that the transmission response of the DUT is scaled from a two-way transmission response to a one-way transmission response.

14. The measurement system of claim 10, wherein the instructions of the computer program that implement time gating comprise instructions that implement applying a time gate to the measured reflection response such that a time-gated response is produced, the time-gated response comprising a portion of the measured reflection response corresponding to a reflection from the known reflective termination.

15. The measurement system of claim 14, wherein the instructions of the computer program that implement time gating further comprise instructions that implement one or both of transforming the measured reflection response from a frequency domain to a time domain before applying a time gate and transforming the time-gated response to a frequency domain after applying a time gate.

16. The measurement system of claim 10, wherein the instructions of the computer program, when executed by the controller, further implement establishing the known reflective termination on the second port of the DUT prior to measuring a reflection response from the first port.

17. The measurement system of claim 10, wherein the known reflective termination at the second port of the DUT has a known reflection response, the known reflective termination is selected from a short circuit calibration standard, an open circuit calibration standard, a broadband device rendered reflective, a narrowband device that is reflective outside an operational frequency range of the narrowband device; and a reflective termination for which a reflection response is known a priori.

18. The measurement system of claim 10, wherein the known reflective termination comprises a reflector blocking an aperture of an antenna.

19. The measurement system of claim 10, wherein the DUT comprises one or both of an antenna and a cable attached to the antenna, the second port being an aperture of the antenna.

20. The measurement system of claim 10, wherein the instructions of the computer program, when executed by the controller, determine the transmission response of the DUT from a one-port reflection response measurement by the vector network analyzer using a range of frequencies of interest that includes an operational frequency range for the DUT.

21. A method of determining a transmission response of a device under test (DUT) from a one-port reflection response measurement comprising:

establishing a known reflective termination on a second port of the DUT;

measuring a reflection response from a first port of the DUT, the known reflective termination being on the second port of the DUT during measurement; and time gating the measured reflection response to produce a gated reflection response, the gated reflection response comprising a portion of the measured reflection response corresponding to a reflection from the known reflective termination, wherein the gated reflection response is the transmission response of the DUT.

22. A measurement system that determines a transmission response of a device under test (DUT) from a one-port reflection response measurement, the measurement system comprising:
a vector network analyzer attached to a first port of the DUT;
a known reflective termination on a second port of the DUT;
a controller that controls the vector network analyzer;
a memory that is accessed by the controller; and
a computer program stored in the memory and executed by the controller,
wherein the computer program comprises instructions that, when executed by the controller, implement measuring a reflection response from the first port of the DUT with the vector network analyzer, the known reflective termination being on the second port of the DUT during measurement; and time gating the measured reflection response to produce a gated reflection response, the gated reflection response comprising a portion of the measured reflection response corresponding to a reflection from the known reflective termination, wherein the gated reflection response is the transmission response of the DUT.

* * * * *